(12) United States Patent
Gandhi et al.

(10) Patent No.: US 9,837,383 B2
(45) Date of Patent: Dec. 5, 2017

(54) INTERCONNECT STRUCTURE WITH IMPROVED CONDUCTIVE PROPERTIES AND ASSOCIATED SYSTEMS AND METHODS

(71) Applicant: Micron Technology, Inc., Boise, ID (US)

(72) Inventors: Jaspreet S. Gandhi, Boise, ID (US); Wayne H. Huang, Boise, ID (US); James M. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/229,618

(22) Filed: Aug. 5, 2016

(65) Prior Publication Data
US 2016/0343689 A1   Nov. 24, 2016

Related U.S. Application Data

(62) Division of application No. 14/281,449, filed on May 19, 2014, now Pat. No. 9,412,675.

(51) Int. Cl.
*H01L 25/065* (2006.01)
*H01L 25/075* (2006.01)
(Continued)

(52) U.S. Cl.
CPC .......... *H01L 25/0657* (2013.01); *H01L 23/00* (2013.01); *H01L 23/34* (2013.01); *H01L 23/4012* (2013.01); *H01L 23/49827* (2013.01); *H01L 24/05* (2013.01); *H01L 24/11* (2013.01); *H01L 24/13* (2013.01); *H01L 24/81* (2013.01); *H01L 25/043* (2013.01); *H01L 25/065* (2013.01); *H01L 25/0756* (2013.01); *H01L 25/50* (2013.01); *H01L 23/3675* (2013.01); *H01L 23/42* (2013.01); *H01L 23/49811* (2013.01); *H01L 2224/05599* (2013.01); *H01L 2224/11* (2013.01); *H01L 2224/13111* (2013.01); *H01L 2224/13147* (2013.01); *H01L 2224/13155* (2013.01); *H01L 2224/16145* (2013.01); *H01L 2224/16225* (2013.01);
(Continued)

(58) Field of Classification Search
CPC . H01L 25/0657; H01L 25/0756; H01L 25/117
See application file for complete search history.

(56) References Cited

U.S. PATENT DOCUMENTS 7,354,798 B2   4/2008   Pogge et al.
8,710,670 B2   4/2014   Kim et al.
(Continued)

*Primary Examiner* — Phat X Cao
(74) *Attorney, Agent, or Firm* — Perkins Coie LLP

(57) ABSTRACT

Interconnect structures with improved conductive properties are disclosed herein. In one embodiment, an interconnect structure can include a first conductive member coupled to a first semiconductor die and a second conductive member coupled to second semiconductor die. The first conductive member includes a recessed surface defining a depression. The second conductive member extends at least partially into the depression of the first conductive member. A bond material within the depression can at least partially encapsulate the second conductive member and thereby bond the second conductive member to the first conductive member.

14 Claims, 12 Drawing Sheets

(51) Int. Cl.
*H01L 23/00* (2006.01)
*H01L 23/498* (2006.01)
*H01L 23/40* (2006.01)
*H01L 25/04* (2014.01)
*H01L 23/34* (2006.01)
*H01L 25/00* (2006.01)
H01L 23/367 (2006.01)
H01L 23/42 (2006.01)

(52) U.S. Cl.
CPC ............... *H01L 2224/16503* (2013.01); *H01L 2224/73253* (2013.01); *H01L 2224/81815* (2013.01); *H01L 2225/06513* (2013.01); *H01L 2225/06517* (2013.01); *H01L 2225/06527* (2013.01); *H01L 2225/06541* (2013.01); *H01L 2225/06555* (2013.01); *H01L 2225/06586* (2013.01); *H01L 2225/06589* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01327* (2013.01); *H01L 2924/05032* (2013.01); *H01L 2924/15311* (2013.01); *H01L 2924/181* (2013.01)

(56) References Cited

U.S. PATENT DOCUMENTS

| | | | |
|---|---|---|---|
| 2013/0052775 A1* | 2/2013 | Kim | H01L 23/552 438/118 |
| 2014/0203397 A1 | 7/2014 | Yen et al. | |
| 2014/0308540 A1* | 10/2014 | Chou | H01R 13/03 428/647 |

* cited by examiner

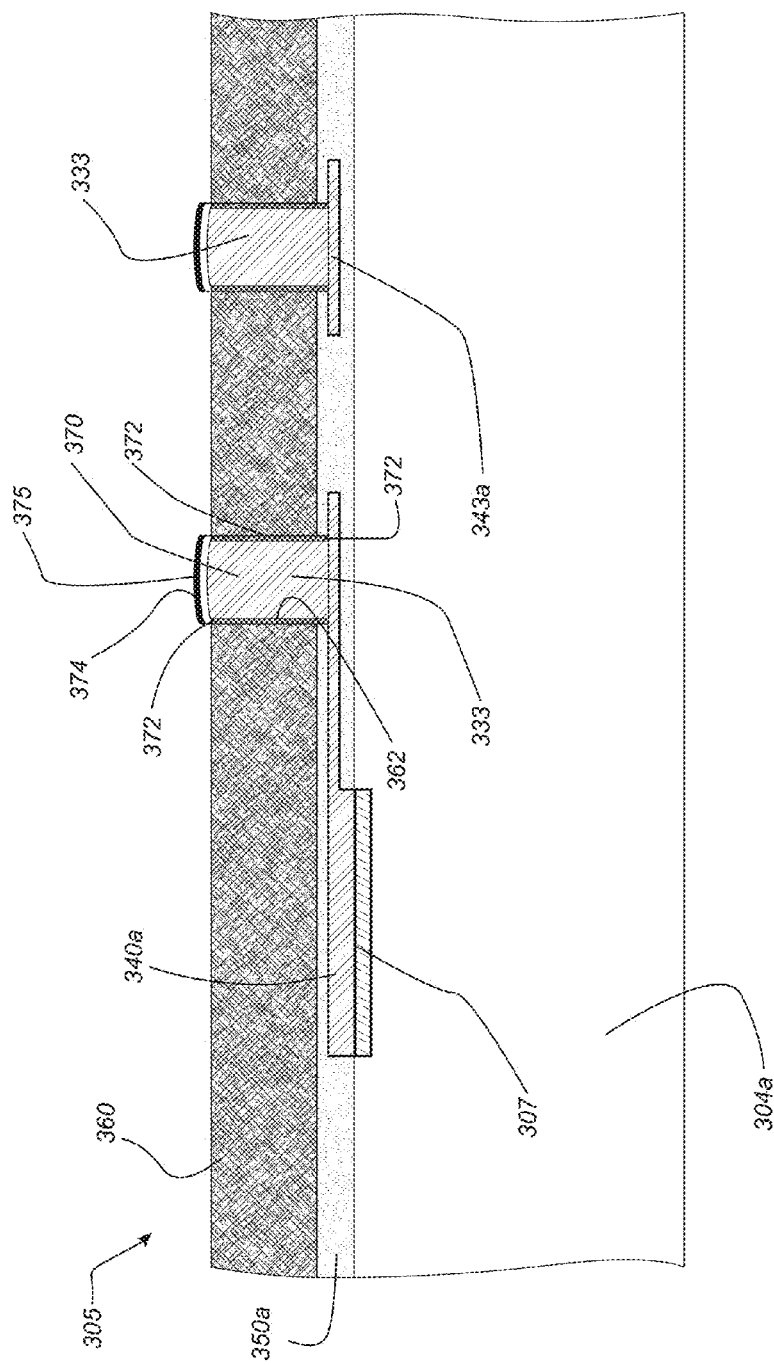

INTERCONNECT STRUCTURE WITH IMPROVED CONDUCTIVE PROPERTIES AND ASSOCIATED SYSTEMS AND METHODS

CROSS-REFERENCE TO RELATED APPLICATION(S)

This application is a divisional of U.S. patent application Ser. No. 14/281,449, filed Aug. 9, 2016, now U.S. Pat. No. 9,412,675, which is incorporated herein by reference in its entirety.

TECHNICAL FIELD

The disclosed embodiments relate to interconnect structures in semiconductor die assemblies. In several embodiments, the present technology relates to an interconnect structure with improved conductive properties, including improved electrical and/or thermal properties.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry. Within some packages, semiconductor dies can be stacked upon and electrically connected to one another by individual interconnects placed between adjacent dies.

BRIEF DESCRIPTION OF THE DRAWINGS

FIGS. 3A-3I are cross-sectional views illustrating a semiconductor device at various stages in a method for making interconnect structures or other connectors in accordance with selected embodiments of the present technology.

DETAILED DESCRIPTION

Specific details of several embodiments of stacked semiconductor die assemblies with improved thermal performance and associated systems and methods are described below. The terms "semiconductor device" and "semiconductor die" generally refer to a solid-state device that includes semiconductor material, such as a logic device, memory device, or other semiconductor circuit, component, etc. Also, the terms "semiconductor device" and "semiconductor die" can refer to a finished device or to an assembly or other structure at various stages of processing before becoming a finished device. Depending upon the context in which it is used, the term "substrate" can refer to a wafer-level substrate or to a singulated, die-level substrate. A person skilled in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-4.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1:
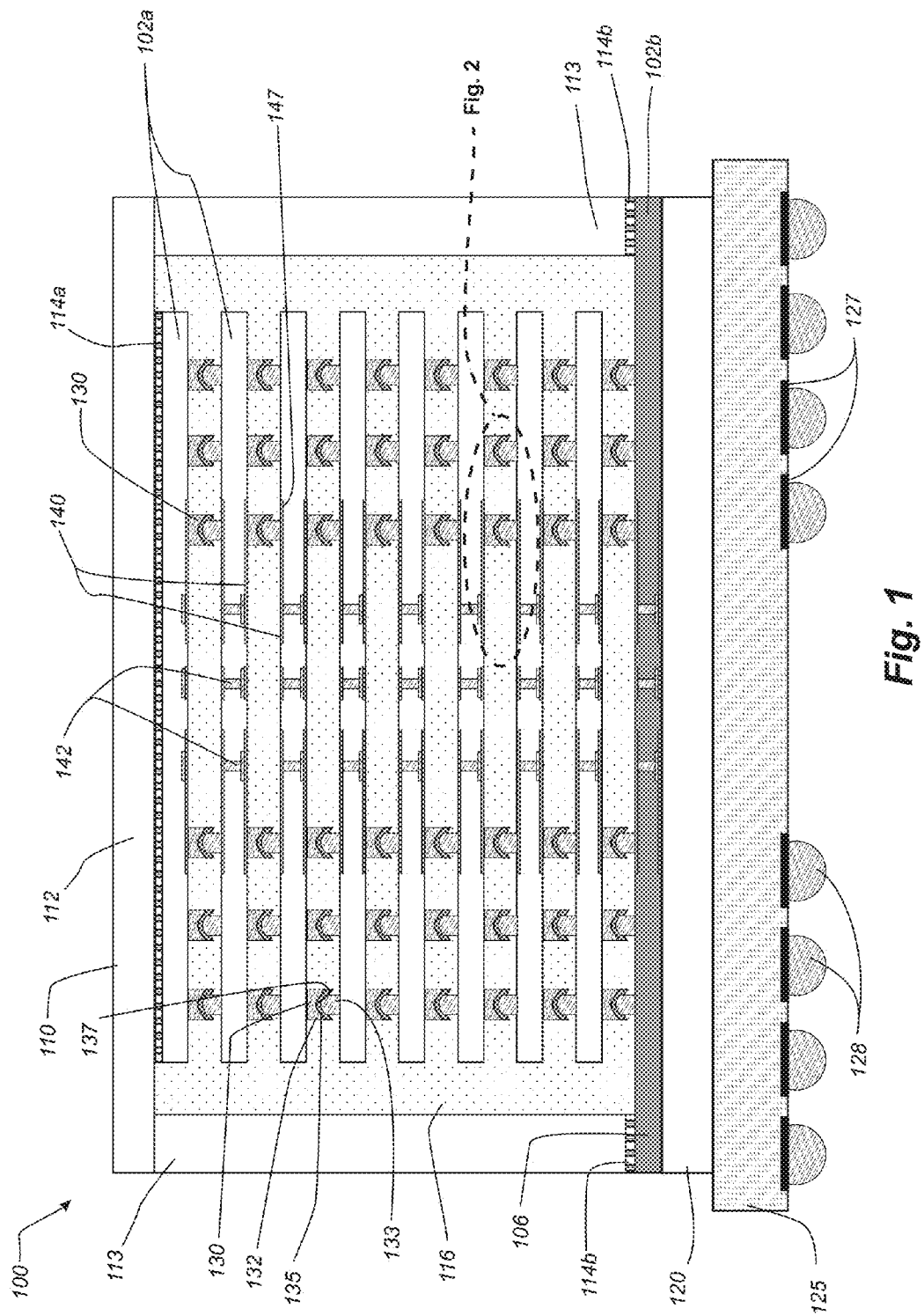
FIG. 1 is a cross-sectional view of a semiconductor die assembly configured in accordance with an embodiment of the present technology.

FIG. 1 is a cross-sectional view of a semiconductor die assembly 100 ("assembly 100") configured in accordance with an embodiment of the present technology. The assembly 100 includes a stack of first semiconductor dies 102a carried by a second semiconductor die 102b (collectively "semiconductor dies 102"). The second semiconductor die 102b, in turn, is carried by an interposer 120. The interposer 120 can include, for example, a semiconductor die, a dielectric spacer, and/or another suitable substrate having electrical connectors (not shown), such as vias, metal traces, etc.) connected between the interposer 120 and a package substrate 125. The package substrate 125 can include, for example, an interposer, a printed circuit board, another logic die, or another suitable substrate connected to package contacts 127 (e.g., bond pads) and electrical connectors 128 (e.g., solder balls) that electrically couple the assembly 100 to external circuitry (not shown). In some embodiments, the package substrate 125 and/or the interposer 120 can be configured differently. For example, in some embodiments the interposer 120 can be omitted and the second semiconductor die 102b can be directly connected to the package substrate 125.

The assembly 100 can further include a thermally conductive casing 110 ("casing 110"). The casing 110 can include a cap portion 112 and a wall portion 113 attached to or integrally formed with the cap portion 112. The cap portion 112 can be attached to the top-most first semiconductor die 102a by a first bond material 114a (e.g., an adhesive). The wall portion 113 can extend vertically away from the cap portion 112 and be attached to a peripheral portion 106 of the first semiconductor die 102a (known to those skilled in the art as a "porch" or "shelf) by a second bond material 114b (e.g., an adhesive). In addition to providing a protective covering, the casing 110 can serve as a heat spreader to absorb and dissipate thermal energy away from the semiconductor dies 102. The casing 110 can accordingly be made from a thermally conductive material, such as nickel (Ni), copper (Cu), aluminum (Al), ceramic materials with high thermal conductivities (e.g., aluminum nitride), and/or other suitable thermally conductive materials.

In some embodiments, the first bond material 114a and/or the second bond material 114b can be made from what are known in the art as "thermal bond materials" or "TIMs", which are designed to increase the thermal contact conductance at surface junctions (e.g., between a die surface and a heat spreader). TIMs can include silicone-based greases, gels, or adhesives that are doped with conductive materials (e.g., carbon nano-tubes, solder materials, diamond-like carbon (DLC), etc.), as well as phase-change materials. In other embodiments, the first bond material 114a and/or the second bond material 114b can include other suitable materials, such as metals (e.g., copper) and/or other suitable thermally conductive materials.

Some or all of the first and/or second semiconductor dies 102 can be at least partially encapsulated in a dielectric underfill material 116. The underfill material 116 can be deposited or otherwise formed around and/or between some or all of the dies to enhance a mechanical connection with a die and/or to provide electrical isolation between conductive features and/or structures (e.g., interconnects). The underfill material 116 can be a non-conductive epoxy paste, a capillary underfill, a non-conductive film, a molded underfill, and/or include other suitable electrically-insulative materials. In several embodiments, the underfill material 116 can be selected based on its thermal conductivity to enhance heat dissipation through the dies of the assembly 100. In some embodiments, the underfill material 116 can be used in lieu the first bond material 114a and/or the second bond material 114b to attach the casing 110 to the top-most first semiconductor die 102a The semiconductor dies 102 can each be formed from a semiconductor substrate, such as silicon, silicon-on-insulator, compound semiconductor (e.g., Gallium Nitride), or other suitable substrate. The semiconductor substrate can be cut or singulated into semiconductor dies having any of variety of integrate circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a hybrid memory cube (HMC) in which the first semiconductor dies 102a provide data storage (e.g., DRAM dies) and the second semiconductor die 102b provides memory control (e.g., DRAM control) within the HMC. In some embodiments, the assembly 100 can include other semiconductor dies in addition to and/or in lieu of one or more of the semiconductor dies 102. For example, such semiconductor dies can include integrated circuit components other than data storage and/or memory control components. Further, although the assembly 100 includes nine dies stacked on the interposer 120, in other embodiments the assembly 100 can include fewer than nine dies (e.g., six dies) or more than nine dies (e.g., twelve dies, fourteen dies, sixteen dies, thirty-two dies, etc.). For example, in one embodiment, the assembly 100 can include four memory dies stacked on two logic dies. Also, in various embodiments, the semiconductor dies 102 can have different sizes. For example, in some embodiments the second die 102b can have the same footprint as at least one of the first semiconductor dies 102a.

As further shown in FIG. 1, the assembly 100 includes a plurality of interconnect structures 130 positioned between each of the semiconductor dies 102. At least a portion of the interconnect structures 130 can be coupled to a redistribution network 147 having conductive traces 140 or other suitable conductive structures (e.g., contact pads) formed on each of the semiconductor dies 102. The conductive traces 140 traces, in turn, can be coupled to a plurality of through-substrate interconnects (TSVs) 142. The TSVs 142 can extend through each of the semiconductor dies 102 and couple together corresponding conductive traces 140 on opposite sides of each of the dies 102. In the illustrated embodiment, the TSVs 142 are disposed toward the center of the semiconductor dies 102, and the conductive traces 140 fan outwardly from the TSVs 142 to connect to individual interconnect structures 130. In other embodiments, however, the TSVs 142, the conductive traces 140, and/or the interconnect structures 130 can be arranged differently. Further, in several embodiments the redistribution network 147 can be omitted and the interconnect structures 130 can be in direct contact with the corresponding TSVs 142.

The interconnect structures 130 can each include a first conductive member 132 and a second conductive member 133 coupled to the first conductive member 132 by a bond material 135. In one aspect of the embodiment of FIG. 1, the bond material 135 can at least partially encapsulate the second conductive member 133 within a depression 137 located in the first conductive member 132. As described in greater detail below, in several embodiments the bond material 135 can be configured to enhance the electrical and/or thermal coupling between the first and second conductive members 132 and 133.

In some embodiments, certain interconnect structures 130 can be "dummy" structures that are not electrically coupled to any of the semiconductor dies 102. For example, in the illustrated embodiment, the outermost interconnect structures 130 at each of the semiconductor dies 102 are not connected to the redistribution network 147. In several embodiments, these "dummy" interconnect structures can be positioned at various locations on the semiconductor dies 102 (e.g., toward the periphery, center, etc.) to provide additional mechanical support and/or enhance heat transfer throughout the regions between the semiconductor dies 102.

Figure 2:
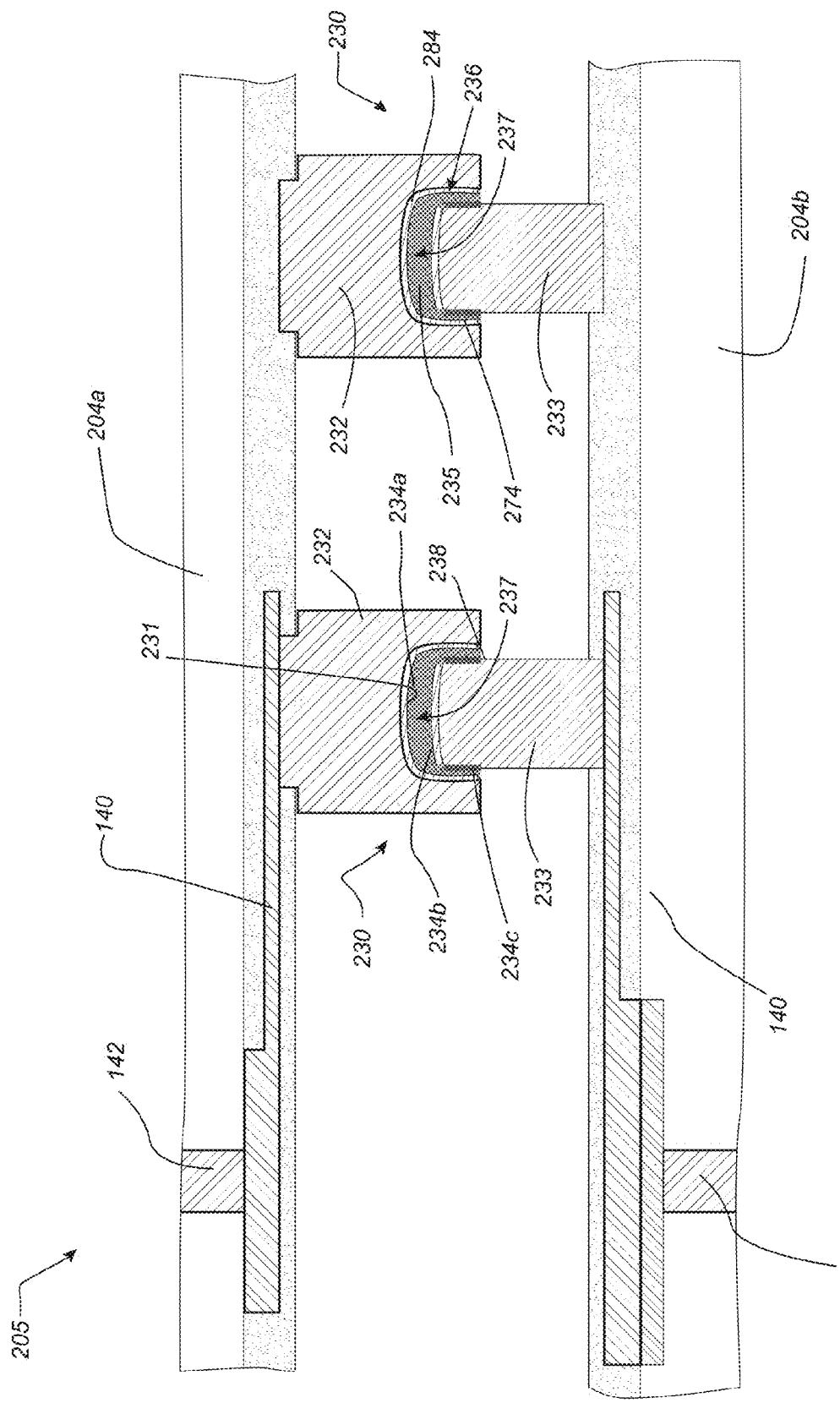
FIG. 2 is an enlarged cross-sectional view of a semiconductor device that includes interconnect structures configured in accordance with an embodiment of the present technology.

FIG. 2 is an enlarged view of a semiconductor device 205 that includes individual interconnect structures 230 configured in accordance with an embodiment of the present technology. As shown, each of the interconnect structures 230 includes a first conductive member, or cup 232, coupled to a second conductive member, or pillar 233, by a bond material 235. The cup 232 is attached to a first substrate 204a (e.g., a semiconductor wafer or die) and can include a recessed surface 231 defining a depression 237 that contains the bond material 235. In the illustrated embodiment, the cup 232 extends (e.g., projects) beyond a surface of the first substrate 204a. In other embodiments, however, the cup 232 can be at least partially recessed below this surface. The pillar 233 is attached to a second substrate 204b (e.g., a semiconductor wafer or die) and extends (e.g., projects) at least partially into the depression 237 of the cup 232. In several embodiments, the cup 232 and the pillar 233 can each include copper or copper alloy materials. Further, in some embodiments, a first barrier material 274 (e.g., a nickel material) can be formed on the cup 232, and a second barrier material 284 (e.g., a nickel material) can be formed on the pillar 233.

In the illustrated embodiment, the bond material 235 forms a conductive joint 236 that at least partially encapsulates the pillar 233 within the cup 232. The bond material can include, for example, solder (e.g., metal solder) and/or other suitable conductive bonding materials (e.g., a conductive epoxy or paste). The bond material 235 can be heated (e.g., reflowed) and react with the conductive materials of the cup 232 and the pillar 233 to form intermetallics 234

(identified individually as first and second intermetallics 234a and 234b) that bond the bond material 235 to the cup 232 and the pillar 233. For example, when a tin/silver (SnAg) bond material reacts with a nickel-based barrier material, the reaction can form tin/nickel (SnNi) intermetallics. In some embodiments, the bond material 235 can form a third intermetallic 234c when the bond material 235 reacts with the conductive material (e.g., copper) at a sidewall 238 of the pillar 332. For example, the reaction of tin/silver solder with copper can form a tin/copper intermetallic (SnCu).

In contrast to the interconnect structures 230, conventional metal contacts typically have flat contact surfaces that are bonded together with metal solder. For example, metal contacts can be bonded together by placing a solder ball between the metal contacts and then reflowing the solder so that it reacts with the metal at the contact surfaces of the contacts. One challenge with conventional solder joints, however, is that solder can migrate or spread during reflow. For example, the solder can be displaced when it squeezed between the metal contacts. Also, certain forces, such as surface tension, can cause the solder to wick away from a contact surface and onto other surfaces. One specific challenge occurs when the solder wicks onto and forms an intermetallic on the sidewalls of a metal contact. This intermetallic at the sidewalls can ultimately degrade the overall electrical and/or thermal conductively of the contact. For example, conventional tin/copper intermetallics can reduce the overall thermal conductivity of a copper-based contact. Further, in vertical interconnects (e.g., copper posts), the solder can consume a substantial amount of metal, which can cause the interconnect to slump and/or form voids in the sidewalls (e.g., due to Kirkendall voiding).

Interconnect structures configured in accordance with several embodiments of the present technology, can address these and other limitations of conventional interconnects and related structures. In particular, the cup 232 and the pillar 233 can be configured to prevent the formation of intermetallics outside of the depression 237. In one aspect of this embodiment, the cup 232 can contain the bond material within the depression 237 during reflow to prevent the spread or migration of the bond material 235. Also, in some embodiments, surface tension can hold the bond material 235 within the depression 237. In another aspect of this embodiment, the volume of the bond material 235 can be selected to limit the conversion of conductive materials (e.g., copper) into intermetallics. For example, the volume can be selected such that the bond material 235 is fully consumed before a substantial portion or any of the material at the sidewall 238 of the pillar 233 is converted into an intermetallic. In several embodiments the bond material 235 can be fully converted into intermetallics. In such embodiments, the first intermetallic 234a can contact the second intermetallic 234b and/or the third intermetallic 234c within the depression 237.

Figure 3A:
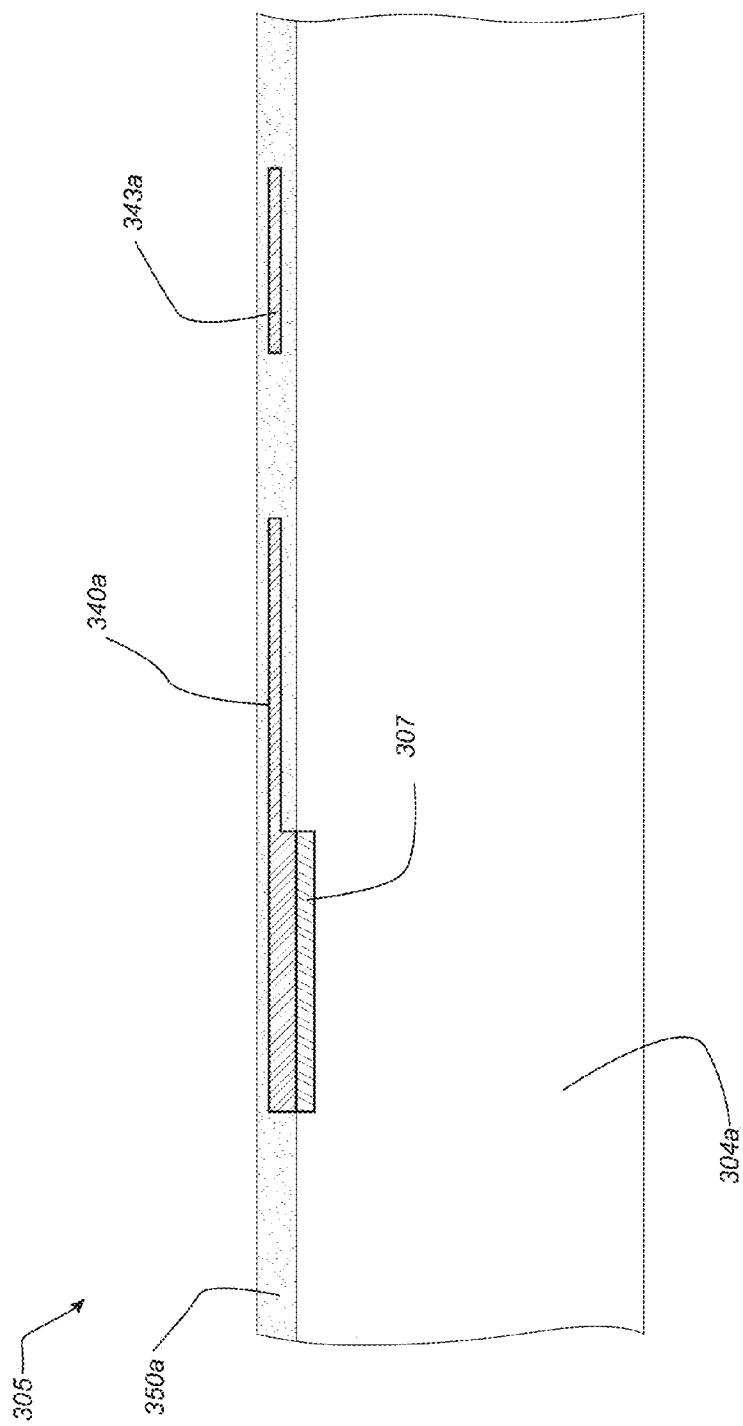

FIGS. 3A-3I are partially schematic cross-sectional views illustrating a portion of a semiconductor device 305 at various stages in a method for making interconnect structures in accordance with selected embodiments of the present technology. Referring first to FIG. 3A, the semiconductor device 305 includes a first substrate 304a (e.g., a silicon wafer or die) and a dielectric material 350a (e.g., silicon oxide) formed thereon. The semiconductor device 305 further includes a conductive trace 340a and a contact pad 343a buried within the dielectric material 350a. As shown, the conductive trace 340a is coupled to a substrate contact 307 (e.g., a copper bond pad), and the contact pad 343a is electrically isolated from the substrate contact 307 by the dielectric material 350a. In several embodiments, the conductive trace 340a and the contact pad 343a can each include copper, copper alloy, and/or other suitable conductive materials.

Figure 3B:
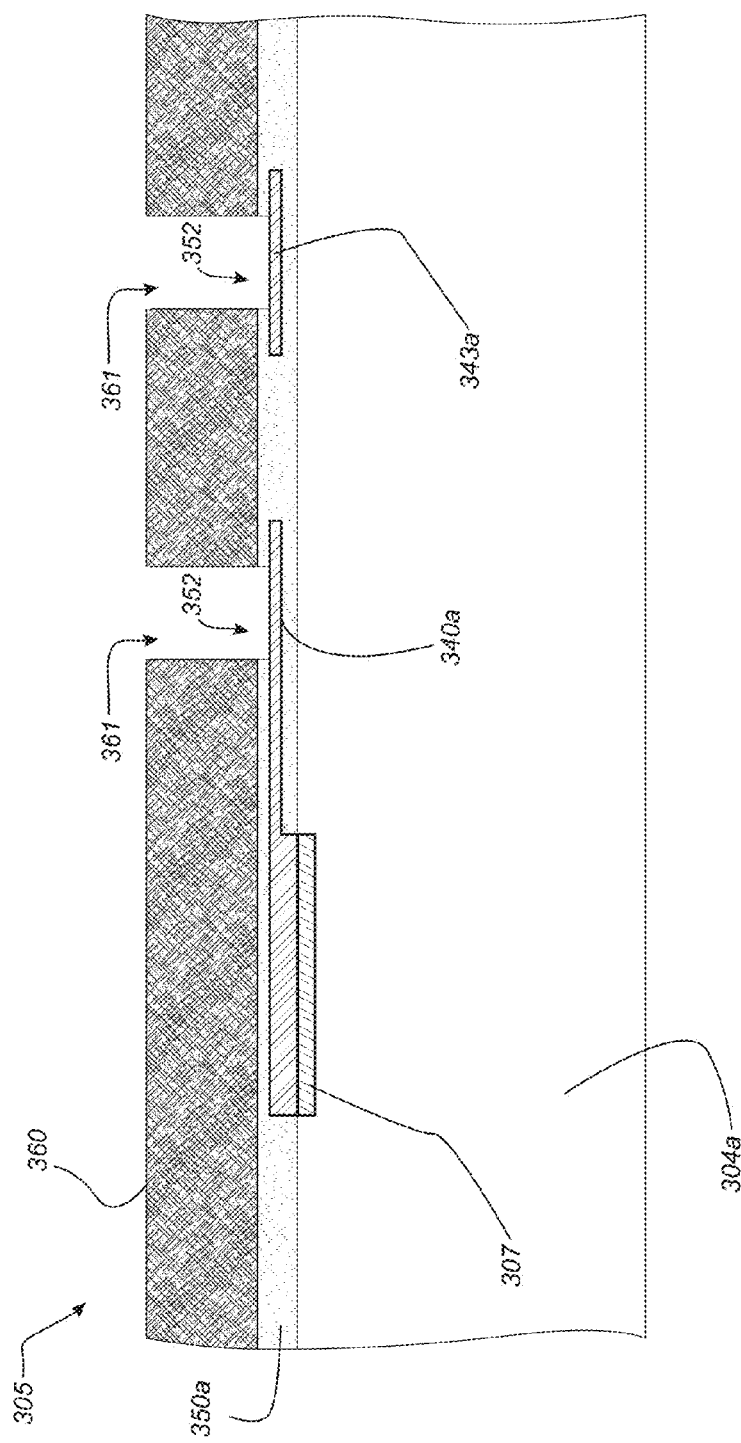

FIG. 3B shows the semiconductor device 305 after forming a mask 360 (e.g., a photoresist mask, hard mask, etc.) and openings 352 in the dielectric material 350a. The openings 352 can be formed by removing (e.g., etching) portions of the dielectric material 350a through corresponding mask openings 361 defined in the mask 360. As shown in FIG. 3B, the openings 352 in the dielectric material 350a can expose portions of the underlying conductive trace 340a and the contact pad 343a.

FIG. 3C shows the semiconductor device 305 after forming conductive members, or pillars 333, on the conductive trace 340a and the contact pad 343a. In several embodiments, the pillars 333 can be formed by depositing a seed material 372 (e.g., copper) on sidewalls 362 of the mask openings 361 (FIG. 3B) and electroplating a conductive material 370 (e.g., copper) onto the conductive trace 340a and the contact pad 343a. In the illustrated embodiment, a barrier material 374 (e.g., nickel) and an interface material 375 (e.g., palladium) can also be electroplated in sequence onto the conductive material 372. In other embodiments, the pillars 333 can be formed by other suitable deposition techniques, such as sputter deposition.

Figure 3D:
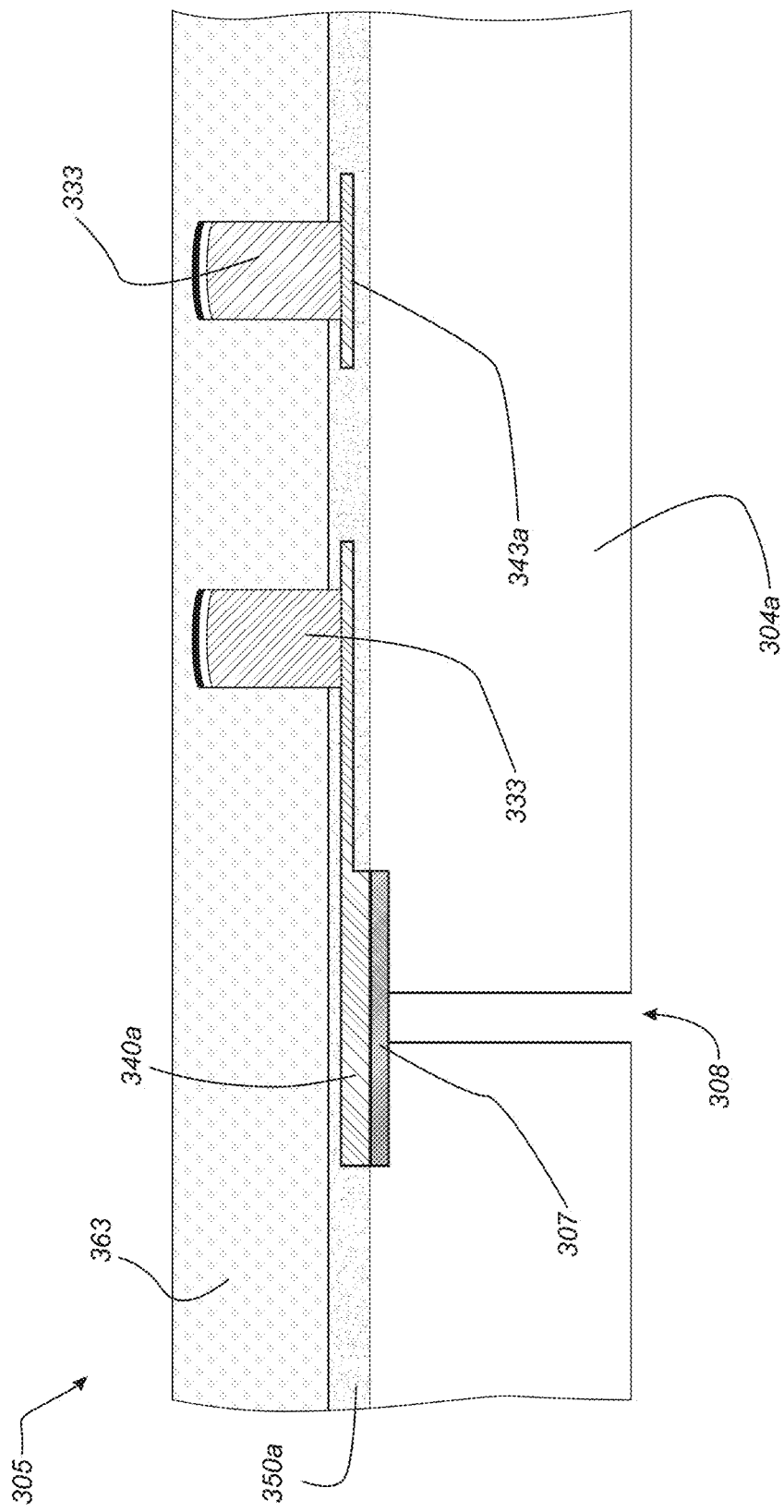

FIG. 3D shows the semiconductor device 305 after forming an opening 308 in the first substrate 304a and forming a protective material 363 over the pillars 333. As shown, the opening 308 extends through the first substrate 304a and exposes a portion of the substrate contact 307 toward the base of the opening 308. In several embodiments, the opening 308 can be formed by first thinning the first substrate 304a (e.g., via etching, backgrinding, etc.) and then removing substrate material (e.g., via an etch). In the illustrated embodiment, the protective material or film 363 (e.g., a polymeric film) can protect the pillars 333 during manufacturing.

Figure 3E:
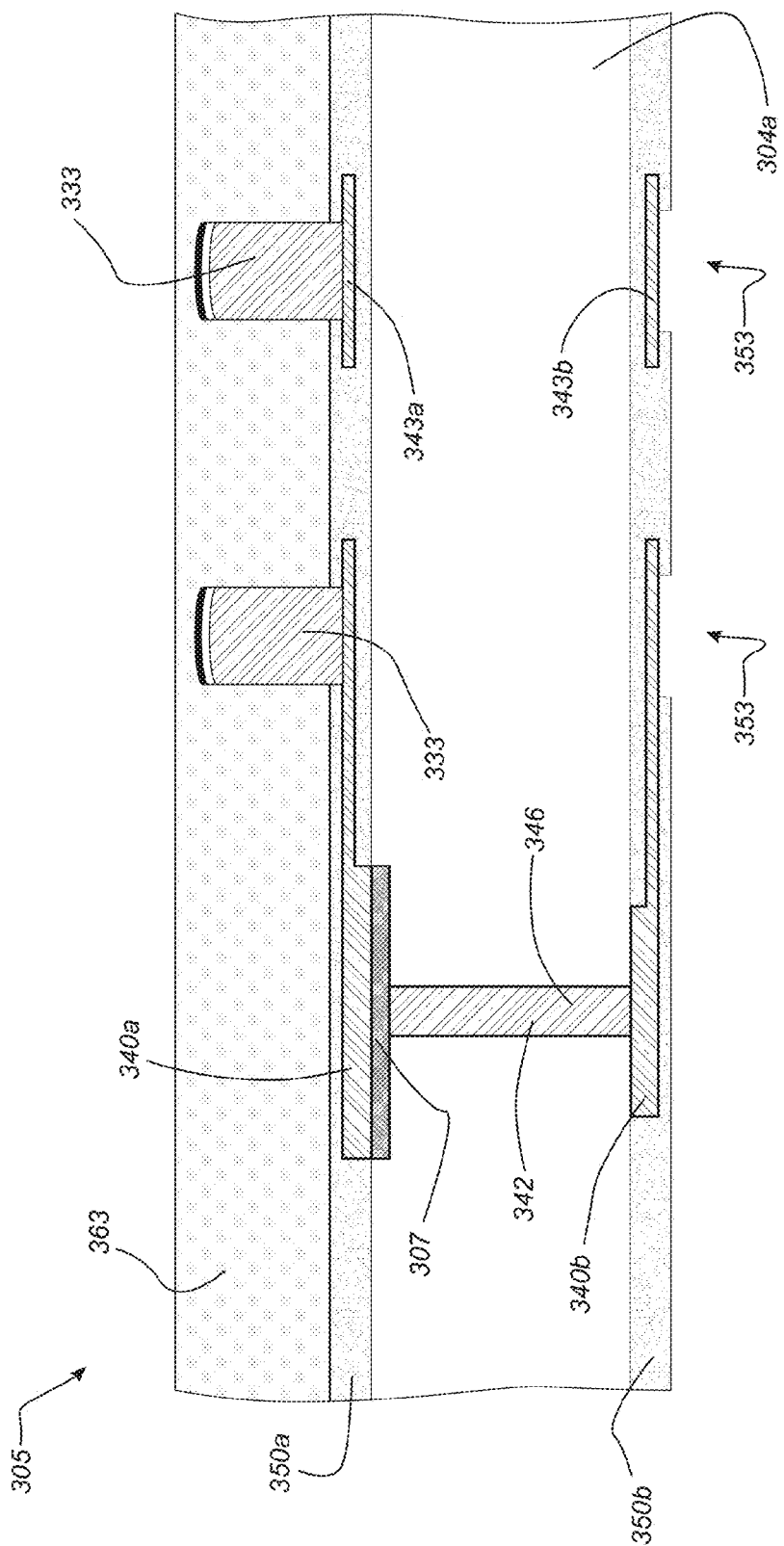

FIG. 3E shows the semiconductor device 305 after forming a TSV 342, a dielectric material 350b, a conductive trace 340b, and a contact pad 343b. The TSV 342 can be formed by filling the opening 308 (FIG. 3D) in the first substrate 304a with a conductive material 376, such as copper or copper alloy. The dielectric material 350b can include openings 353 that expose portions of the underlying conductive trace 340b and the contact pad 343b. In several embodiments, the conductive trace 340b, the contact pad 343b, and the dielectric material 350b can be similar in structure and function as the conductive trace 340a, the contact pad 343a, and the dielectric material 350a.

Figure 3F:
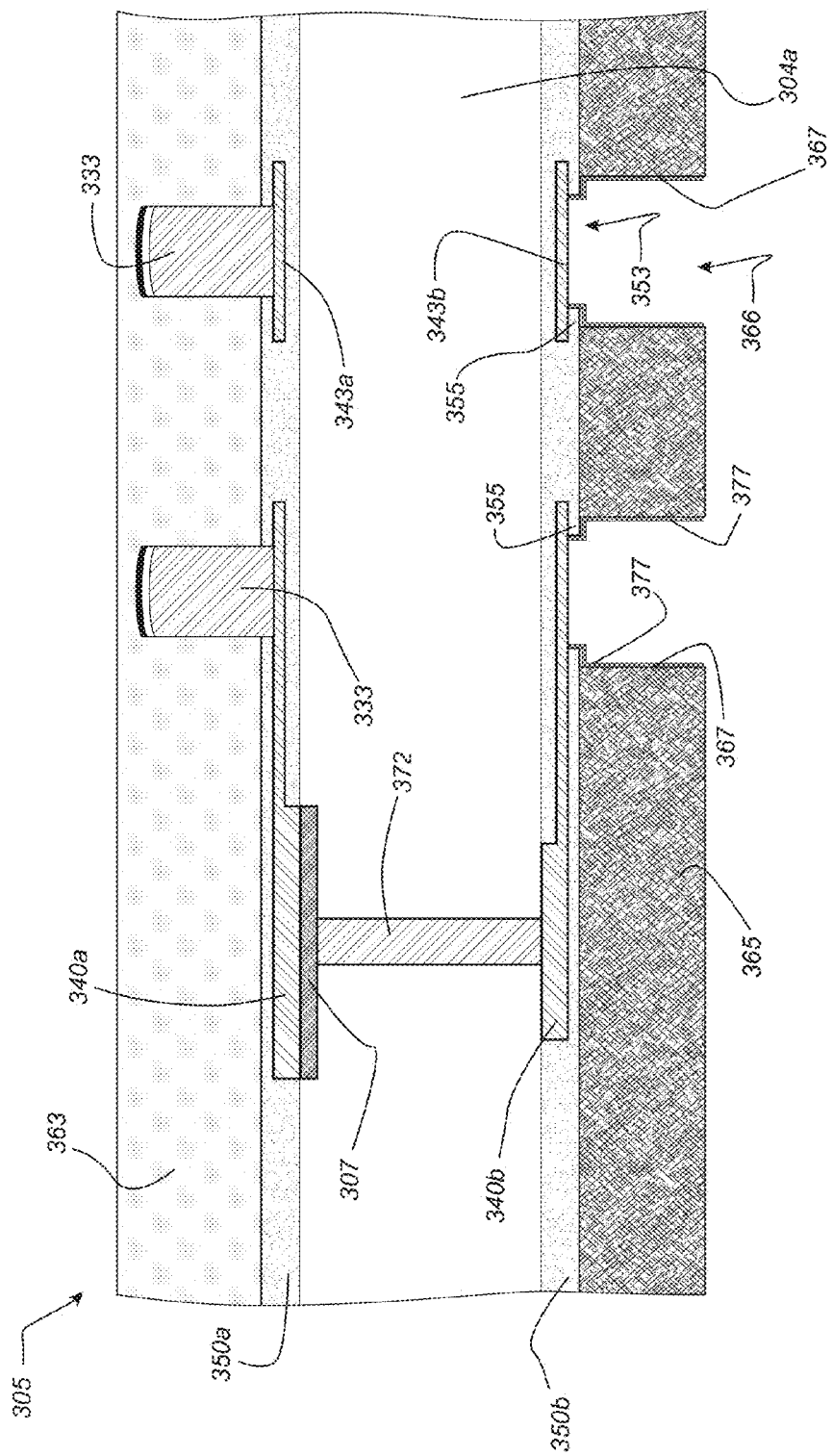

FIG. 3F shows the semiconductor device 305 after forming a mask 365 on the dielectric material 350b. The mask 365 include mask openings 366 having a seed material (e.g., a copper seed material) formed on sidewalls 367 of the mask 365 within the mask openings 366. In the illustrated embodiment, the mask openings 366 are configured to expose edge portions 355 of the dielectric material 350b toward the base of the openings 353.

Figure 3G:
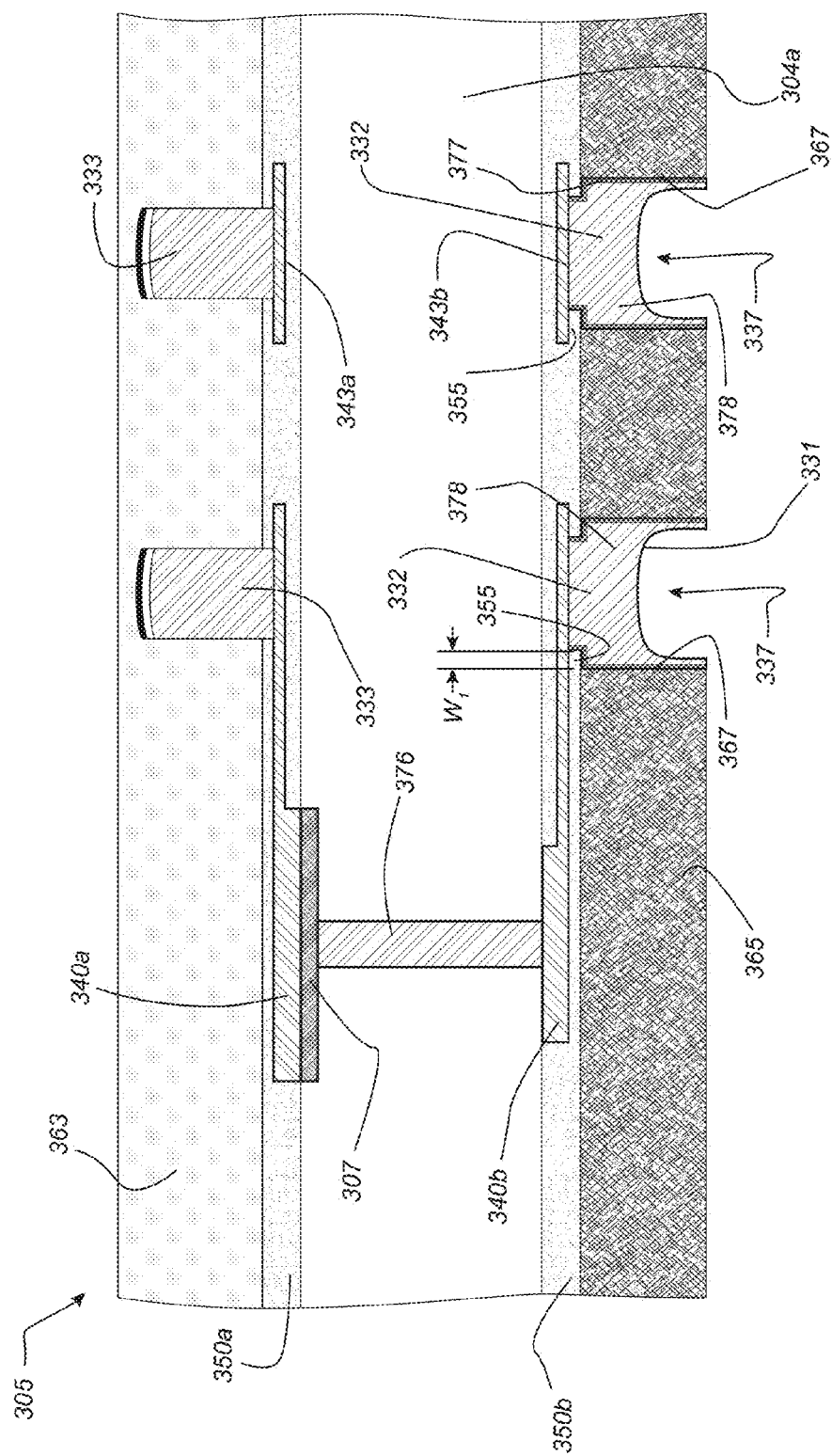

FIG. 3G shows the semiconductor device 305 after forming conductive members, or cups 332, within the mask openings 366 (FIG. 3F) of the mask 365. In several embodiments, the cups 332 can be formed by electroplating a conductive material 378 (e.g., copper) onto the conductive trace 340b, the contact pad 343b, and the seed material 377. As further shown in FIG. 3G, the cups 332 each include a recessed surface 331 defining a depression 337. It is believed that the edge portions 355 of the dielectric material 350b can be configured such that the depression 337 is formed in-situ during electroplating. In particular, it is believed that the edge portions 355 can influence the physical and/or chemical interactions that occur during electroplating toward the sidewalls 367 of the mask 365. These chemical and/or physical interactions are believed to cause non-uniform metal deposition that result in the formation of the depression 337. For example, it is believed that the edge portions 355 may create discontinuities in the composition of the seed material 377, produce localized regions of high current density in the electroplating current, and/or cause non-linear diffusion of metal ions. Without wishing to be bound by theory, it is believed that a width $W_1$ of the peripheral portion in the range of about 5 µm to about 20 µm (e.g., 10 µm) can result in the formation of the depression 337. Further, without wishing to be bound by theory, it is believed that the size (e.g., the depth) of the depression 337 can be correlative with the size (e.g., the lateral width) of the edge portions 355.

In other embodiments, the depression 337 can be formed using additional or alternate techniques. For example, in some embodiments the an electroplating bath can include certain additives, such as organic additives (e.g., brighteners, levers, surfactants, etc.), that causes deposit metal preferentially toward the sidewalls 367 of the mask 365. In some embodiments, the conductive material 378 can be etched to form the depression 337 rather than employing the edge portions 355 alone or at all. Further, while having a generally curved profile in the illustrated embodiment, in other embodiments the depression 337 can have a different shape, size, depth, and/or profile (e.g., a rectangular profile).

Figure 3H:
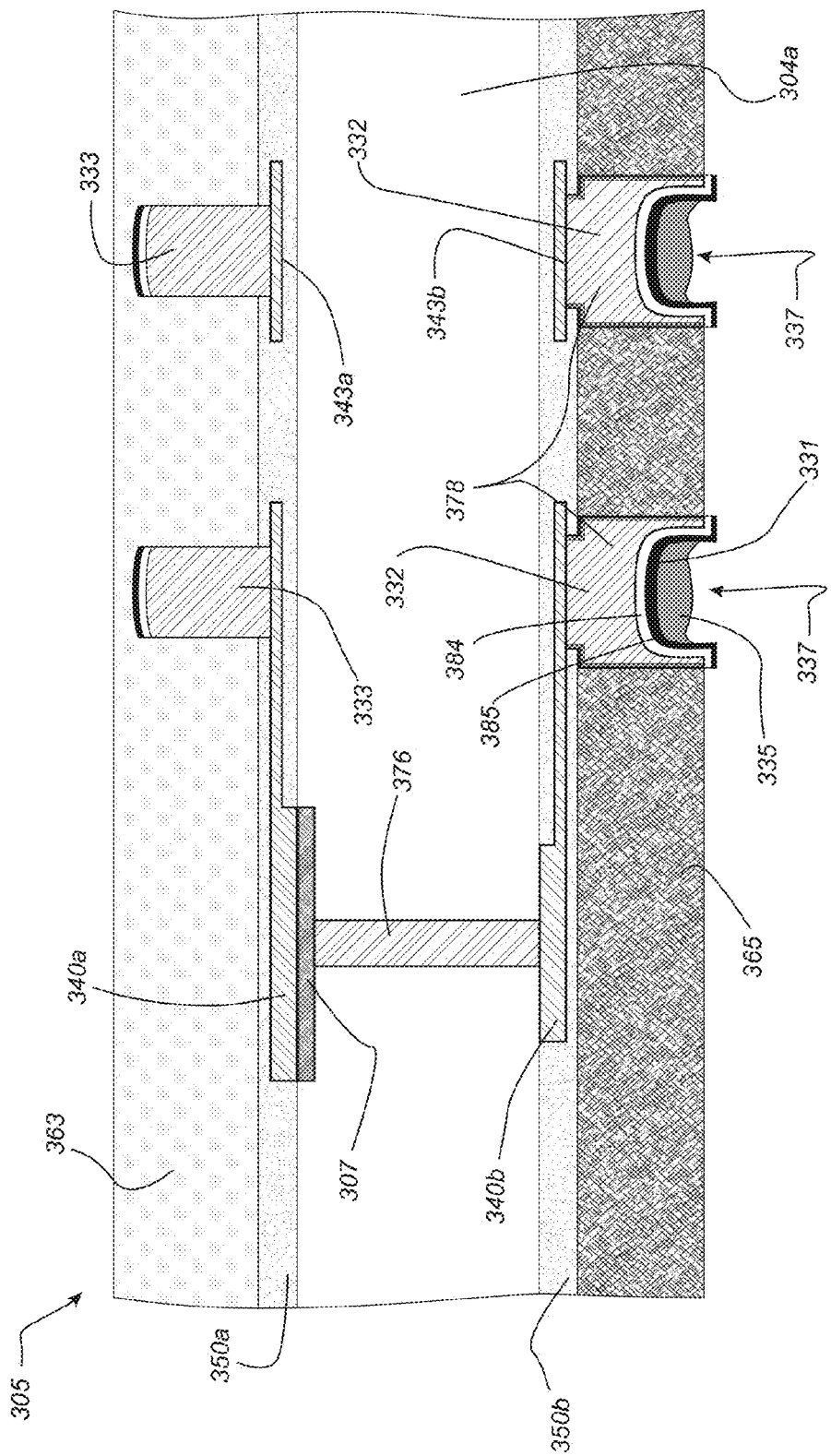

FIG. 3H shows the semiconductor device 305 after forming a barrier material 384 (e.g., nickel), an interface material 385 (e.g., palladium), and a bond material 335 (e.g., tin/silver) at least partially within the depression 337. In several embodiments, the barrier material 384, the interface material 385, and the bond material 335 can be electroplated in sequence onto the conductive material 378 of the cups 332. In another embodiment, one or more of these materials can be formed by other deposition techniques. For example, in certain embodiments, the bond material 335 can be disposed in the form of a solder ball positioned on the interface material 385 within the depression 337.

Figure 3I:
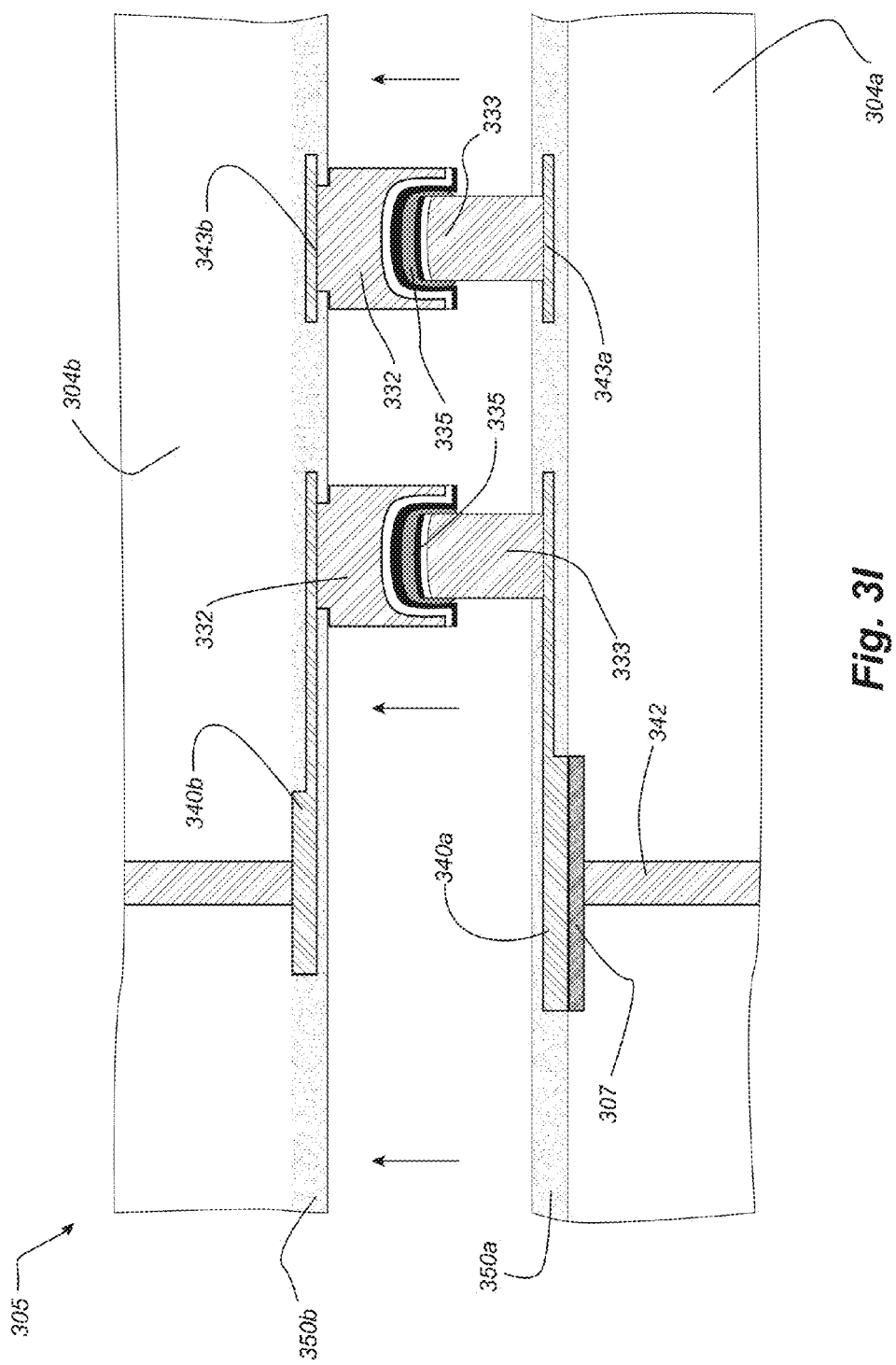

FIG. 3I shows the semiconductor device 305 after removing the mask 365 and the protective film 363 (FIG. 3H) and coupling the pillars 333 of the first substrate 304a to corresponding cups 332 of a second substrate 304b. In several embodiments, the cups 332 of the second substrate 304b can be generally similar in structure and function to the cups 332 of the first substrate 304a (FIG. 3H). As shown, the bond material 335 has been heated (e.g., reflowed) and the pillars 333 have been inserted into the corresponding depression 337 of each of the cups 332. In some embodiments, the volume of the bond material 335 can be selected to account for displacement of the bond material 335 due to the insertion of the pillars 333 into the cups 332. Once the pillars 333 are inserted into position, the bond material 335 can be allowed to cool and solidify into a conductive joint 336 between each pair of the pillar and cups 332 and 333.

Figure 4:
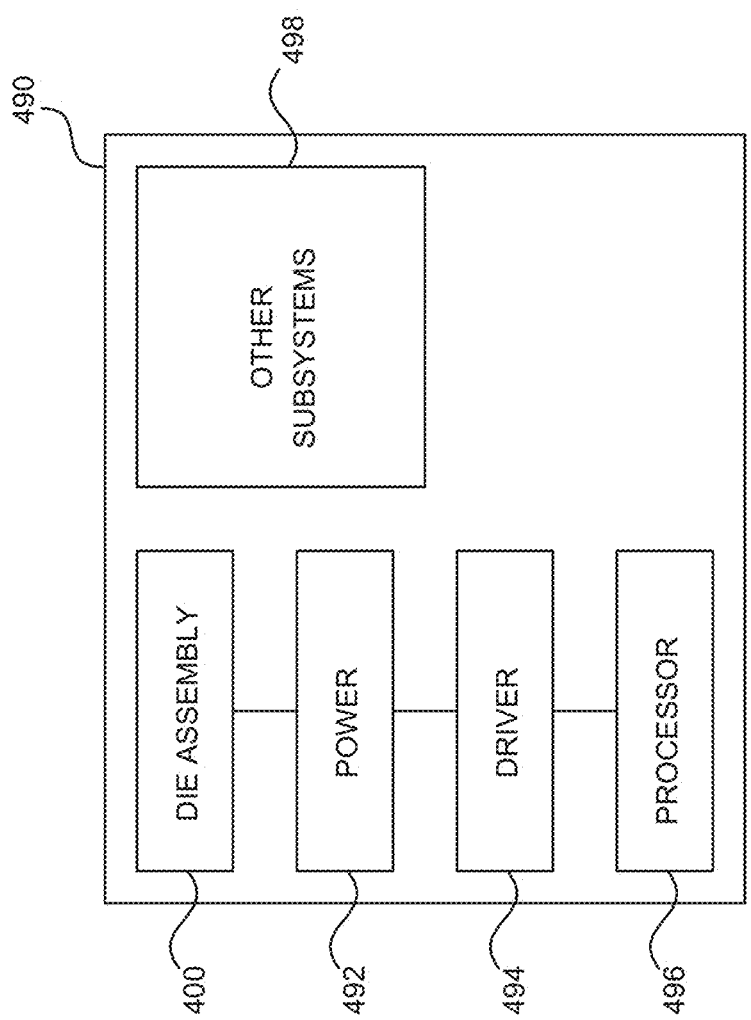
FIG. 4 is a schematic view of a system that includes a semiconductor die assembly configured in accordance with embodiments of the present technology.

Any one of the interconnect structures and/or semiconductor die assemblies described above with reference to FIGS. 1-3I can be incorporated into any of a myriad of larger and/or more complex systems, a representative example of which is system 490 shown schematically in FIG. 4. The system 490 can include a semiconductor die assembly 400, a power source 492, a driver 494, a processor 496, and/or other subsystems or components 498. The semiconductor die assembly 400 can include features generally similar to those of the stacked semiconductor die assemblies described above, and can therefore include various features that enhance heat dissipation. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, and appliances. Components of the system 490 may be housed in a single unit or distributed over multiple, interconnected units (e.g., through a communications network). The components of the system 490 can also include remote devices and any of a wide variety of computer readable media.

From the foregoing, it will be appreciated that specific embodiments of the technology have been described herein for purposes of illustration, but that various modifications may be made without deviating from the disclosure. For example, although several of the embodiments of the semiconductor dies assemblies are described with respect to HMCs, in other embodiments the semiconductor die assemblies can be configured as other memory devices or other types of stacked die assemblies. In addition, while in the illustrated embodiments certain features or components have been shown as having certain arrangements or configurations, other arrangements and configurations are possible. For example, while the TSV 342 (FIG. 3E) in the illustrated embodiment is formed after front-end metallization (i.e., after forming the substrate contact 307), in other embodiments the TSV 342 can be formed before or concurrently with front-end metallization. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of forming a semiconductor die assembly, comprising:
    forming a dielectric material on a second semiconductor die;
    forming first openings in the dielectric material that expose underlying conductive features;
    forming a mask on the dielectric material, wherein the mask includes second openings superimposed on the first openings such that portions of the dielectric material are exposed within the second openings;
    depositing a conductive material on each of the conductive features and the portions of the dielectric material within the second openings, wherein the portions of the dielectric material are configured such that a plurality of depressions form in the conductive material in-situ with the deposition of the conductive material;
    inserting at least a portion of a plurality of first conductive members on a first semiconductor die into at least a portion of the depressions in the corresponding conductive material on the second semiconductor die; and
    covering at least a portion of each of the first conductive members with a bond material within the depression located in each of the corresponding conductive material.

2. The method of claim 1, further comprising heating the bond material to form intermetallics within the depression located in each of the corresponding conductive material.

3. The method of claim 1, further comprising heating the bond material to fully convert the bond material into one or more intermetallics.

4. The method of claim 1 wherein the bond material includes solder, and wherein the method further includes reflowing the solder.

5. The method of claim 1, further comprising:
reacting the bond material with a portion of the corresponding first conductive member to form a first intermetallic at least partially within the depression in the corresponding conductive material; and
reacting the bond material with a portion of the corresponding conductive material to form a second intermetallic at least partially within the depression in the corresponding conductive material.

6. The method of claim 5 wherein the first intermetallic and the second intermetallic materials each include tin/nickel (SnNi).

7. The method of claim 5 wherein the first intermetallic includes tin/nickel (SnNi), and the second intermetallic includes tin/copper (SnCu).

8. The method of claim 1 wherein the bond material includes tin/silver (SnAg).

9. The method of claim 1, further comprising forming a redistribution network on the first semiconductor die, wherein the first semiconductor die includes a plurality of through-substrate interconnects (TSVs) electrically coupled to the redistribution network.

10. The method of claim 1, further comprising at least partially encasing the first semiconductor die and the second semiconductor die within a thermally conductive casing.

11. The method of claim 1 wherein:
the first conductive members include copper pillars;
the conductive material includes a copper cup;
the first semiconductor die is a logic die or a memory die; and
the second semiconductor die is a logic die or a memory die.

12. The method of claim 1 wherein the conductive material projects toward the first semiconductor die.

13. The method of claim 1 wherein the depression has a curved shape.

14. The method of claim 1 wherein the depression of the corresponding conductive material is defined by a recessed surface of the first conductive member, the method further comprising forming a barrier material over the recessed surface.

* * * * *